(12) United States Patent
Matsumoto et al.

(10) Patent No.: US 10,541,142 B2
(45) Date of Patent: Jan. 21, 2020

(54) MAINTENANCE METHOD OF PLASMA PROCESSING APPARATUS

(71) Applicant: TOKYO ELECTRON LIMITED, Tokyo (JP)

(72) Inventors: Kazuya Matsumoto, Miyagi (JP); Yuki Hosaka, Miyagi (JP); Mitsunori Ohata, Miyagi (JP); Takashi Yamamoto, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/094,986

(22) PCT Filed: Apr. 10, 2017

(86) PCT No.: PCT/JP2017/014697
§ 371 (c)(1),
(2) Date: Oct. 19, 2018

(87) PCT Pub. No.: WO2017/183507
PCT Pub. Date: Oct. 26, 2017

(65) Prior Publication Data
US 2019/0131137 A1    May 2, 2019

(30) Foreign Application Priority Data
Apr. 21, 2016  (JP) ................. 2016-085347

(51) Int. Cl.
*H01L 21/3065*      (2006.01)
*H01L 21/687*       (2006.01)
(Continued)

(52) U.S. Cl.
CPC .... *H01L 21/3065* (2013.01); *H01J 37/32009* (2013.01); *H01J 37/3288* (2013.01);
(Continued)

(58) Field of Classification Search
None
See application file for complete search history.

(56) References Cited

U.S. PATENT DOCUMENTS

2010/0260936 A1* 10/2010 Kato ................. H01L 21/67109
427/255.28

FOREIGN PATENT DOCUMENTS

JP         1-117317 A      5/1989

OTHER PUBLICATIONS

International Search Report dated Jun. 20, 2017 in PCT/JP2017/014697.

* cited by examiner

*Primary Examiner* — Jiong-Ping Lu
(74) *Attorney, Agent, or Firm* — Rothwell, Figg, Ernst & Manbeck, P.C.

(57) ABSTRACT

A plasma processing apparatus includes a support structure configured to support a workpiece and a first drive device configured to rotate the support structure about a first axis extending in a direction orthogonal to a vertical direction. The support structure includes a holding unit including an electrostatic chuck and a container provided under the holding unit. The container includes a tubular container body, and a bottom cover configured to close a bottom side opening of the container body and to be detachable from the container body. A maintenance method includes: rotating a support structure about a first axis such that the bottom cover is positioned above an electrostatic chuck, removing the bottom cover from the container body, and maintaining a component provided in the container body.

16 Claims, 11 Drawing Sheets

(51) Int. Cl.
*H01J 37/32* (2006.01)
*H01L 21/683* (2006.01)
*H05H 1/46* (2006.01)

(52) U.S. Cl.
CPC .......... *H01L 21/683* (2013.01); *H01L 21/687* (2013.01); *H01L 21/6831* (2013.01); *H01L 21/68714* (2013.01); *H01L 21/68742* (2013.01); *H01L 21/68764* (2013.01); *H01L 21/68785* (2013.01); *H01L 21/68792* (2013.01); *H05H 1/46* (2013.01); *H01J 2237/334* (2013.01)

MAINTENANCE METHOD OF PLASMA PROCESSING APPARATUS

CROSS REFERENCE TO RELATED APPLICATION

This application is a 35 U.S.C. 371 National Phase Entry Application from PCT/JP2017/014697, filed Apr. 10, 2017, which claims priority to Japanese Patent Application No. 2016-085347, filed Apr. 21, 2016, the disclosures of which are incorporated herein in their entirety by reference, and priority is claimed to each of the foregoing.

TECHNICAL FIELD

Exemplary embodiments of the present disclosure relate to a maintenance method of a plasma processing apparatus.

BACKGROUND

In manufacturing an electronic device such as, for example, a semiconductor device, a plasma processing (e.g., a plasma etching) may be performed on a workpiece. The plasma processing is performed using a plasma processing apparatus. In plasma processing apparatus, a gas is supplied into a chamber provided by a chamber body, and the gas is excited by a plasma source. Thus, plasma is generated in the chamber, and the workpiece supported by a sample table is processed by ions and/or radicals in the plasma.

As one type of such a plasma processing apparatus, there is a type having a rotation drive device that rotates the sample table about a plasma lead-out direction as an axis and a tilt drive device that tilts the sample table with respect to the plasma lead-out direction. Such a plasma processing apparatus is disclosed in Patent Document 1. In the plasma processing apparatus described in Patent Document 1, the sample table is attached to a rotating body, and the rotating body extends to the inside of a hermetically sealed container. The rotation drive device is provided inside the container.

PRIOR ART DOCUMENT

Patent Document

Patent Document 1: Japanese Laid-Open Patent Publication No. 1-117317

SUMMARY OF THE INVENTION

Problem to be Solved

In the plasma processing apparatus described in Patent Document 1, in order to maintain any one of various components such as the rotation drive device provided inside the container, it is necessary to take an assembly (support structure) including the sample table, the rotating body, and the container out of the container. Therefore, it is not easy to maintain parts constituting the support structure.

Means to Solve the Problem

In an aspect, there is provided a maintenance method of a plasma processing apparatus. The plasma processing apparatus includes a chamber body, a gas supply unit, an exhaust device, a plasma source, a support structure, and a first drive device. The chamber body provides a chamber. The gas supply unit is configured to supply a gas to the chamber. The exhaust device is configured to decompress the chamber. The plasma source is configured to excite the gas inside the chamber. The support structure is configured to support a workpiece inside the chamber. The first drive device is configured to rotate the support structure in the chamber about a first axis that extends in a direction orthogonal to a vertical direction. The support structure includes a holding unit, a container, a seal member, a second drive device, and a rotary connector. The holding unit includes an electrostatic chuck. The electrostatic chuck is configured to hold the workpiece. The holding unit is provided to be rotatable around a second axis orthogonal to the first axis. The container is provided below the holding unit. The seal member is interposed between the container and the holding unit and configured to separate the space inside the container from the chamber. The second drive device is provided inside the container, and configured to rotate the holding unit around the second axis. The rotary connector is electrically connected to an electrode of the electrostatic chuck. The container has a cylindrical container body and a bottom cover. The bottom cover is a member that closes a bottom side opening of the container body, and is configured to be detachable from the container body.

A maintenance method according to an aspect includes: (i) rotating the support structure about the first axis such that the bottom cover is positioned above the electrostatic chuck, (ii) removing the bottom cover from the container body, and (iii) maintaining a component provided in the container body.

In the maintenance method according to the aspect, when maintenance of the component provided inside the container of the support structure is performed, the support structure may be rotated about the first axis such that the bottom cover is located above the electrostatic chuck. Then, the bottom cover may be removed from the container body. Therefore, it is possible to easily access the components inside the container in the state where the support structure disposed inside the chamber body. Therefore, it is easy to maintain components constituting the support structure.

In one embodiment, the holding unit further includes an insulating base member and an anchor. The base member is interposed between the electrostatic chuck and the container body. The anchor is configured to detachably fix the electrostatic chuck to the base member. In this embodiment, the maintenance method further includes (iv) releasing fixation of the electrostatic chuck to the base member by the anchor, and (v) detaching the electrostatic chuck from the base member. In this embodiment, by releasing the fixing of the electrostatic chuck to the base member by the anchors, the electrostatic chuck can be easily removed from the base member. Therefore, maintenance such as replacement of the electrostatic chuck can be easily performed.

In one embodiment, the holding unit has a plurality of through holes formed to extend in a direction in which the second axis extends. The support structure further includes a plurality of pusher pins, a plurality of third drive devices, and a plurality of holders. The plurality of pusher pins are provided to be capable of being inserted into the plurality of through holes, respectively. The plurality of third drive devices are provided inside the container. The plurality of third drive devices are configured to move the plurality of pusher pins individually so as to change the positions of the upper ends of the plurality of pusher pins between a position above the top surface of the electrostatic chuck and a position inside the container. The plurality of holders have a cylindrical shape. The plurality of holders are attached to the plurality of third drive devices, respectively. Base ends of the plurality of pusher pins are fitted into inner holes in the plurality of holders, respectively. In this embodiment, the maintenance method further includes (vi) moving at least one pusher among the plurality of pusher pins such that the upper end of the at least one pusher pin is positioned above the top surface of the electrostatic chuck, and (vii) pulling out the at least one pusher pin from at least one corresponding holder among the plurality of holders. In this embodiment, the pusher pins can be pulled out from the holders in the state where the upper ends of the pusher pins are positioned above the top surface of the electrostatic chuck. Therefore, maintenance such as replacement of pusher pins can be easily performed.

Effect of the Invention

As described above, maintenance of components constituting the support structure is facilitated.

DETAILED DESCRIPTION TO EXECUTE THE INVENTION

Figure 1:
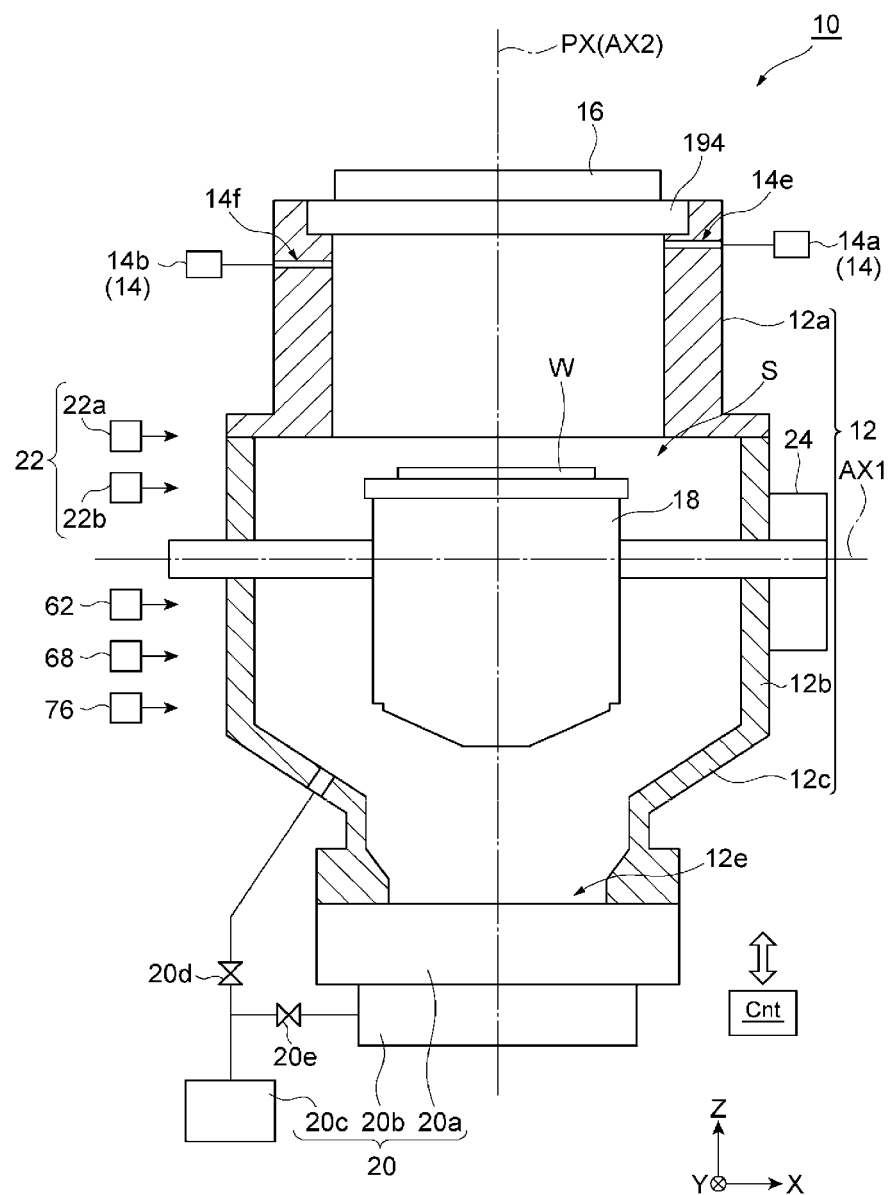
FIG. 1 is a view schematically illustrating a plasma processing apparatus according to an embodiment.

Hereinafter, various embodiments will be described in detail with reference to the drawings. In respective drawings, the same or corresponding portions will be denoted by the same reference numerals.

Figure 2:
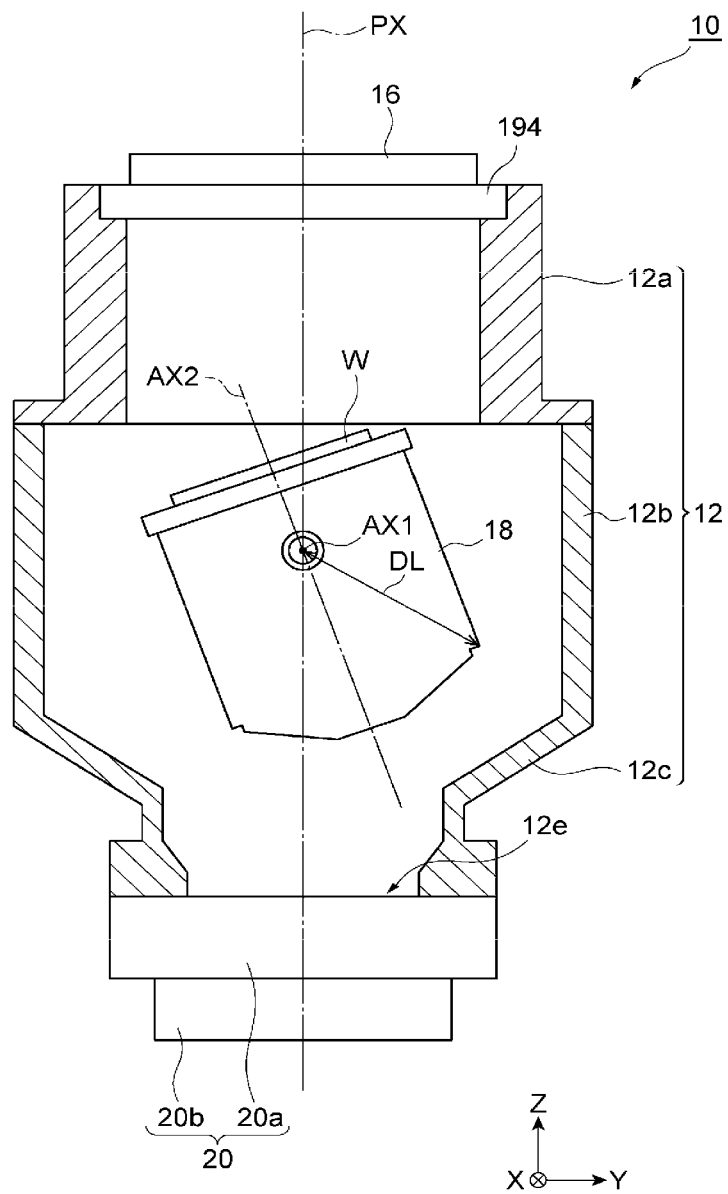
FIG. 2 is a view schematically illustrating the plasma processing apparatus according to the embodiment.

FIGS. 1 and 2 are views schematically illustrating a plasma processing apparatus according to an embodiment, in which the plasma processing apparatus is illustrated by cutting a chamber body in a plane including an axis PX extending in the vertical direction. In FIG. 1, the plasma processing apparatus is illustrated in the state where a rotational direction position around a first axis AX1 of a support structure is set such that a second axis AX2 described later coincides with the axis PX (a non-tilted state). In FIG. 2, the plasma processing apparatus is illustrated in the state where a rotational direction position around the first axis AX1 of the support structure is set such that the second axis AX2 intersects the axis PX (a tilted state).

The plasma processing apparatus 10 illustrated in FIGS. 1 and 2 includes a chamber body 12, a gas supply unit 14, a plasma source 16, a support structure 18, an exhaust device 20, and a first drive device 24. In an embodiment, the plasma processing apparatus 10 may further include a bias power supply 22 and a controller Cnt. The chamber main body 12 has a substantially cylindrical shape. In an embodiment, the central axis of the chamber body 1 coincides with the axis PX. This chamber body 12 provides its inner space, i.e. a chamber S.

In an embodiment, the chamber body 12 includes an upper portion 12a, an intermediate portion 12b, and a lower portion 12c. The upper portion 12a is located above the intermediate portion 12b, and the intermediate portion 12b is located above the lower portion 12c. The intermediate portion 12b and the lower portion 12c form an integral cylindrical body. The upper portion 12a is a cylindrical body separate from the cylindrical body that provides the intermediate portion 12b and the lower portion 12c. The lower end of the upper portion 12a is coupled to the upper end of the intermediate portion 12b. A seal member such as, for example, an O-ring is provided between the lower end of the upper portion 12a and the upper end of the intermediate portion 12b. In addition, the upper portion 12a and the intermediate portion 12b are connected by an anchor, for example, a screw. This upper portion 12a is configured to be detachable from the intermediate portion 12b. When performing the maintenance of the plasma processing apparatus 10, the upper portion 12a is removed from the intermediate portion 12b as necessary.

In a region surrounded by the intermediate portion 12 b, that is, a region for accommodating the support structure 18, the chamber S has a substantially constant width. In addition, in a region below the region for accommodating the support structure 18, the chamber S has a tapered shape that gradually decreases in width toward the bottom portion of the chamber S. Further, the bottom portion of the chamber body 12 provides an exhaust port 12e, which is formed to be axially symmetrical with respect to the axis PX.

The gas supply unit 14 is configured to supply a gas to the chamber S. In an embodiment, the gas supply unit 14 may include a first gas supply unit 14a and a second gas supply unit 14b. The first gas supply unit 14a is configured to supply a first processing gas into the chamber body 12. The second gas supply unit 14b is configured to supply a second processing gas into the chamber body 12. The details of the gas supply unit 14 will be described later.

The plasma source 16 is configured to excite a gas inside the chamber S. In an embodiment, the plasma source 16 is provided in the ceiling portion of the chamber body 12. In addition, in an embodiment, the central axis of the plasma source 16 coincides with the axis PX. The details of an example of the plasma source 16 will be described later.

The support structure 18 is configured to hold the workpiece W inside the chamber body 12. The workpiece W may have a substantially disc shape like a wafer. The support structure 18 is configured to be rotatable about the first axis AX1 extending in a direction orthogonal to the vertical direction. That is, the support structure 18 is capable of changing the angle between the second axis AX2 and the axis PX. In order to rotate the support structure 18, the plasma processing apparatus 10 includes a first drive device 24. The first drive device 24 is provided outside the chamber body 12. The first drive device 24 generates a driving force for rotation of the support structure 18 at the center of the first axis AX1. In addition, the support structure 18 is configured to rotate the workpiece W about the second axis AX2 orthogonal to the first axis AX1. Details of the support structure 18 will be described later.

The exhaust device 20 is configured to decompress the chamber S. In an embodiment, the exhaust device 20 includes an automatic pressure controller 20a, a turbo molecular pump 20b, and a dry pump 20c. The automatic pressure controller 20a is provided directly under the chamber body 12 and connected to the exhaust port 12e. The turbo molecular pump 20b is provided downstream of the automatic pressure controller 20a. The dry pump 20c is directly connected to the chamber S via a valve 20d. Further, the dry pump 20c is connected to the turbo molecular pump 20b via a valve 20e. In the plasma processing apparatus 10, since the exhaust device 20 is connected to the exhaust port 12e provided axially symmetrically with respect to the axis PX, a uniform exhaust flow is can be formed from the periphery of the support structure 18 to the exhaust device 20. As a result, efficient exhaust can be achieved. Further, it is possible to uniformly diffuse the plasma generated inside the chamber S. A flow-straightening member (not illustrated) may be provided inside the chamber S as necessary. The flow-straightening member extends along the inner wall surface of the chamber body 12 so as to surround the support structure 18 from the lateral side and the bottom side. A plurality of through holes are formed in the flow-straightening member.

The bias power supply 22 is configured to selectively impart a bias voltage and high-frequency waves for drawing ions into the workpiece W to the support structure 18. In an embodiment, the bias power supply 22 includes a first power source 22a and a second power source 22b. The first power source 22a generates a pulse-modulated DC voltage (hereinafter, referred to as a "modulated DC voltage") as a bias voltage to be applied to the support structure 18.

The second power source 22b is configured to supply high-frequency waves for drawing ions into the workpiece W to the support structure 18. The frequency of the high-frequency waves is an arbitrary frequency suitable for drawing ions into the workpiece W, and is, for example, 400 kHz. In the plasma processing apparatus 10, it is possible to selectively supply the modulated DC voltage from the first power source 22a and the high-frequency waves from the second power source 22b to the support structure 18. The selective supply of the modulated DC voltage and the high-frequency waves can be controlled by the controller Cnt.

The controller Cnt is, for example, a computer including, for example, a processor, a storage unit, an input device, and a display device. The controller Cnt operates according to a program based on an input recipe and sends out a control signal. Each unit of the plasma processing apparatus 10 is controlled by the control signal from the controller Cnt.

Hereinafter, each of the gas supply unit 14, the plasma source 16, and the support structure 18 will be described in detail.

[Gas Supply Unit]

As described above, the gas supply unit 14 includes a first gas supply unit 14a and a second gas supply unit 14b. The first gas supply unit 14a supplies a first processing gas to the chamber S via at least one gas ejection hole 14e. Further, the second gas supply unit 14b supplies a second processing gas to the chamber S via at least one gas ejection hole 14f. The gas ejection hole 14e is provided at a position closer to the plasma source 16 than the gas ejection hole 14f. Therefore, the first processing gas is supplied to a position closer to the plasma source 16 than the second processing gas. In addition, in FIGS. 1 and 2, each of the number of gas ejection holes 14e and the number of gas ejection holes 14f is "1." However, a plurality of gas discharge holes 14e and a plurality of gas discharge holes 14f may be provided. The plurality of gas ejection holes 14e may be uniformly arranged in the circumferential direction with respect to the axis PX. Further, the plurality of gas ejection holes 14f may also be uniformly arranged in the circumferential direction with respect to the axis PX.

In an embodiment, a partition plate and a so-called ion trap may be provided between a region where the gas is ejected by the gas discharge holes 14e and the region where the gas is discharged by the gas ejection holes 14f. This makes it possible to adjust the amount of ions directed from the plasma of the first processing gas to the workpiece W.

The first gas supply unit 14a may include one or more gas sources, one or more flow controllers, and one or more valves. Therefore, the flow rate of the first processing gas from the one or more gas sources of the first gas supply unit 14a is capable of being adjusted. In addition, the second gas supply unit 14b may include one or more gas sources, one or more flow controllers, and one or more valves. Therefore, the flow rate of the second processing gas from the one or more gas sources of the second gas supply unit 14b is capable of being adjusted. The flow rate of the first processing gas from the first gas supply unit 14a and the supply timing of the first processing gas, and the flow rate of the second processing gas from the second gas supply unit 14b and the supply timing of the second processing gas are individually adjusted by the controller Cnt.

In one example, the first processing gas may be a rare gas. The rare gas is He gas, Ne gas, Ar gas, Kr gas, or Xe gas. In addition, the first processing gas may be a gas selected from He gas, Ne gas, Ar gas, Kr gas, and Xe gas. For example, when etching a workpiece W having a multilayer film, a rare gas suitable for etching each layer is selected. The second processing gas may be a hydrogen-containing gas. As the hydrogen-containing gas, $CH_4$ gas or $NH_3$ gas is exemplified. The active species of hydrogen derived from such a second processing gas modify, for example, a metal contained in one or more layers in the multilayer film to a state of being easily etched by a reducing action. In such an example, the supply amount of the first processing gas and the supply amount of the second processing gas during plasma generation are individually controlled by a control by the controller Cnt.

[Plasma Source]

Figure 3:
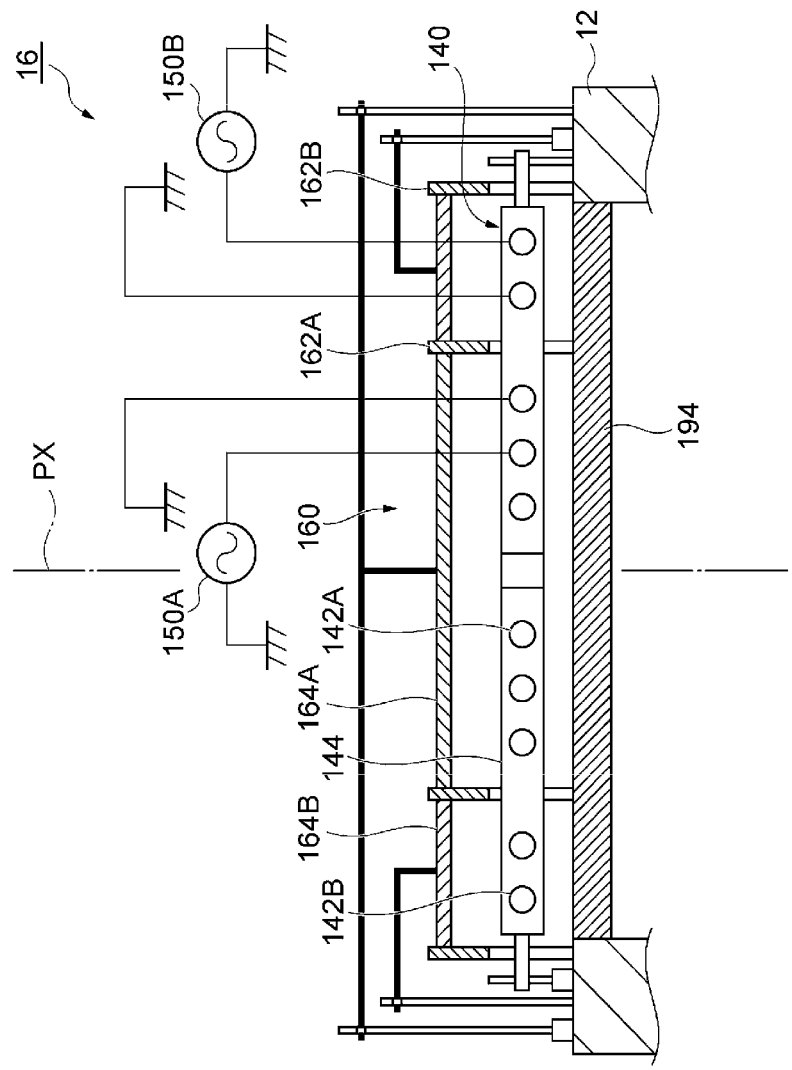
FIG. 3 is a view illustrating a plasma source of an embodiment.
Figure 4:
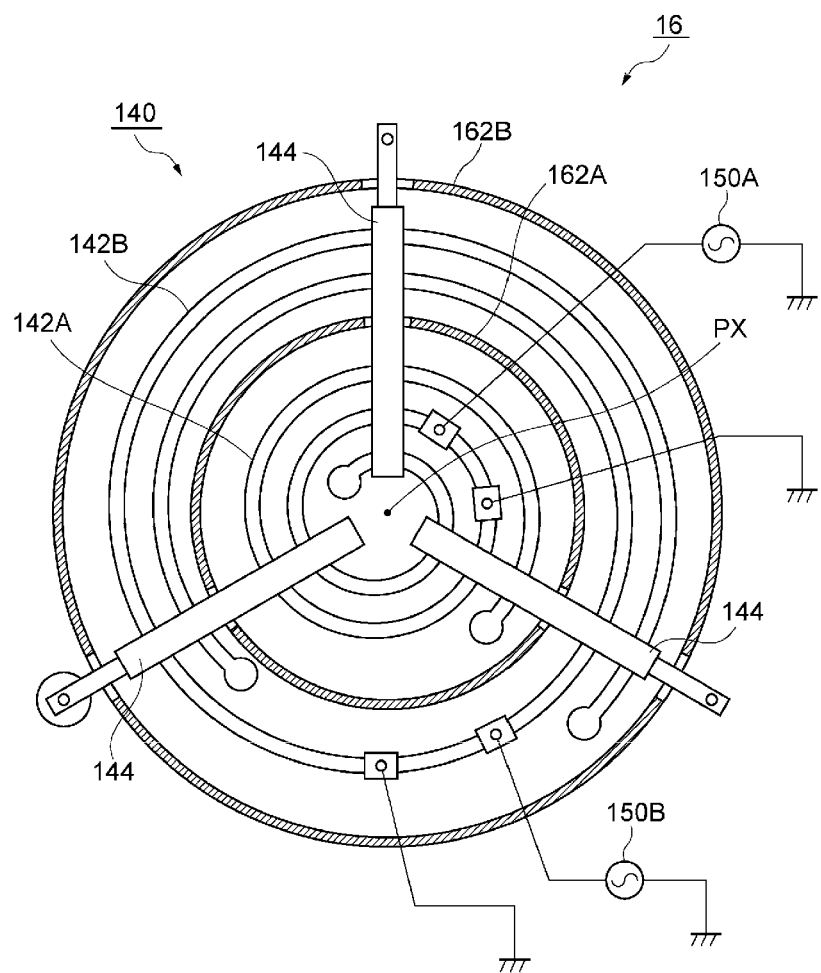
FIG. 4 is a view illustrating the plasma source of the embodiment.

FIGS. 3 and 4 are views illustrating the plasma source of an embodiment. FIG. 3 illustrates a plasma source viewed in a Y-direction (the direction orthogonal to the axis PX and the first axis AX1) of FIG. 1, in which the plasma source is partially broken. FIG. 4 illustrates the plasma source viewed from the upper side in a Z-direction (the vertical direction) of FIG. 1, in which the plasma source is partially broken. As illustrated in FIGS. 1 and 3, an opening is provided in the ceiling portion of the chamber body 12, and the opening is closed by a dielectric plate 194. The dielectric plate 194 is a plate-shaped body and is made of quartz or ceramic. The plasma source 16 is provided on the dielectric plate 194.

As illustrated in FIGS. 3 and 4, the plasma source 16 includes a high-frequency antenna 140 and a shield member 160. The high-frequency antenna 140 is covered with the shield member 160. In an embodiment, the high-frequency antenna 140 includes an inner antenna element 142A and an outer antenna element 142B. The inner antenna element 142A is provided closer to the axis PX than the outer antenna element 142B. In other words, the outer antenna element 142B is provided outside the inner antenna element 142A so as to surround the inner antenna element 142A. Each of the inner antenna element 142A and the outer antenna element 142B is made of a conductor such as, for example, copper, aluminum, or stainless steel, and extends helically with respect to the axis PX.

Both the inner antenna element 142A and the outer antenna element 142B are sandwiched by a plurality of holders 144. The plurality of holders 144 are, for example, rod-shaped members and extend radially with respect to the axis PX.

The shield member 160 has an inner shield wall 162A and an outer shield wall 162B. The inner shield wall 162A has a cylindrical shape extending in the vertical direction and is provided between the inner antenna element 142A and the outer antenna element 142B. The inner shield wall 162A surrounds the inner antenna element 142A. In addition, the outer shield wall 162B has a cylindrical shape extending in the vertical direction and is provided to surround the outer antenna element 142B.

On the inner antenna element 142A, an inner shield plate 164A is provided. The inner shield plate 164A has a disc shape and is provided to close an opening in the inner shield wall 162A. In addition, an outer shield plate 164B is provided on the outer antenna element 142B. The outer shield plate 164B is an annular plate and is provided to close an opening between the inner shield wall 162A and the outer shield wall 162B.

A high-frequency power source 150A and a high-frequency power source 150 B are connected to the inner antenna element 142A and the outer antenna element 142B, respectively. The high-frequency power source 150A and the high-frequency power source 150 B are high frequency power sources for plasma generation. The high-frequency power source 150A and the high-frequency power source 150B supply high-frequency waves having the same frequency or different frequencies to the inner antenna element 142A and the outer antenna element 142B, respectively. For example, when high-frequency waves having a predetermined frequency (e.g., 40 MHz) are supplied from the high-frequency power source 150A to the inner antenna element 142A with predetermined power, the processing gas supplied to the chamber S is excited by an induced magnetic field formed in the chamber S, and donut-shaped plasma is generated in the central region on the workpiece W. In addition, when high-frequency waves having a predetermined frequency (e.g., 60 MHz) are supplied from the high-frequency power source 150B to the outer antenna element 142B with predetermined power, the processing gas supplied to the chamber S is excited by an induced magnetic field formed in the chamber S, and donut-shaped plasma is generated in the peripheral edge region on the workpiece W. By such plasma, active species such as radicals are generated from the processing gas.

[Support Structure]

Figure 5:
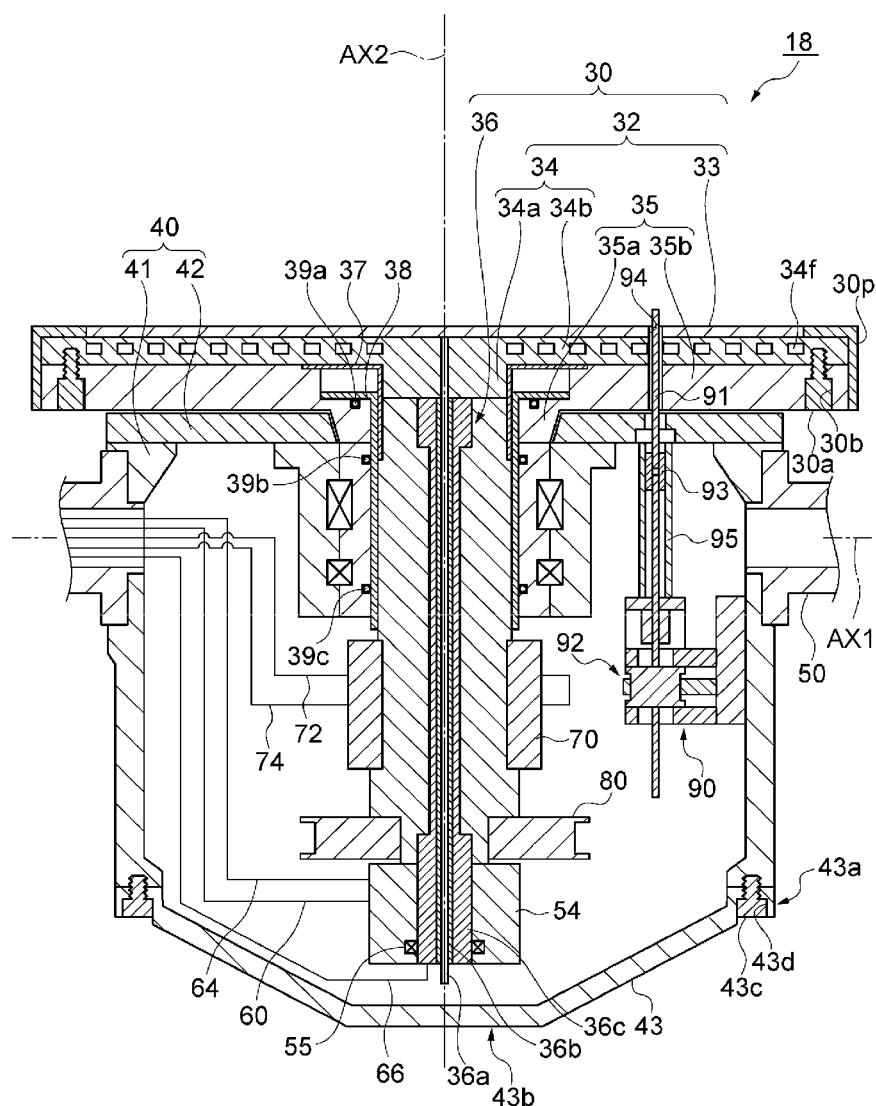
FIG. 5 is a cross-sectional view illustrating a support structure according to an embodiment.
Figure 6:
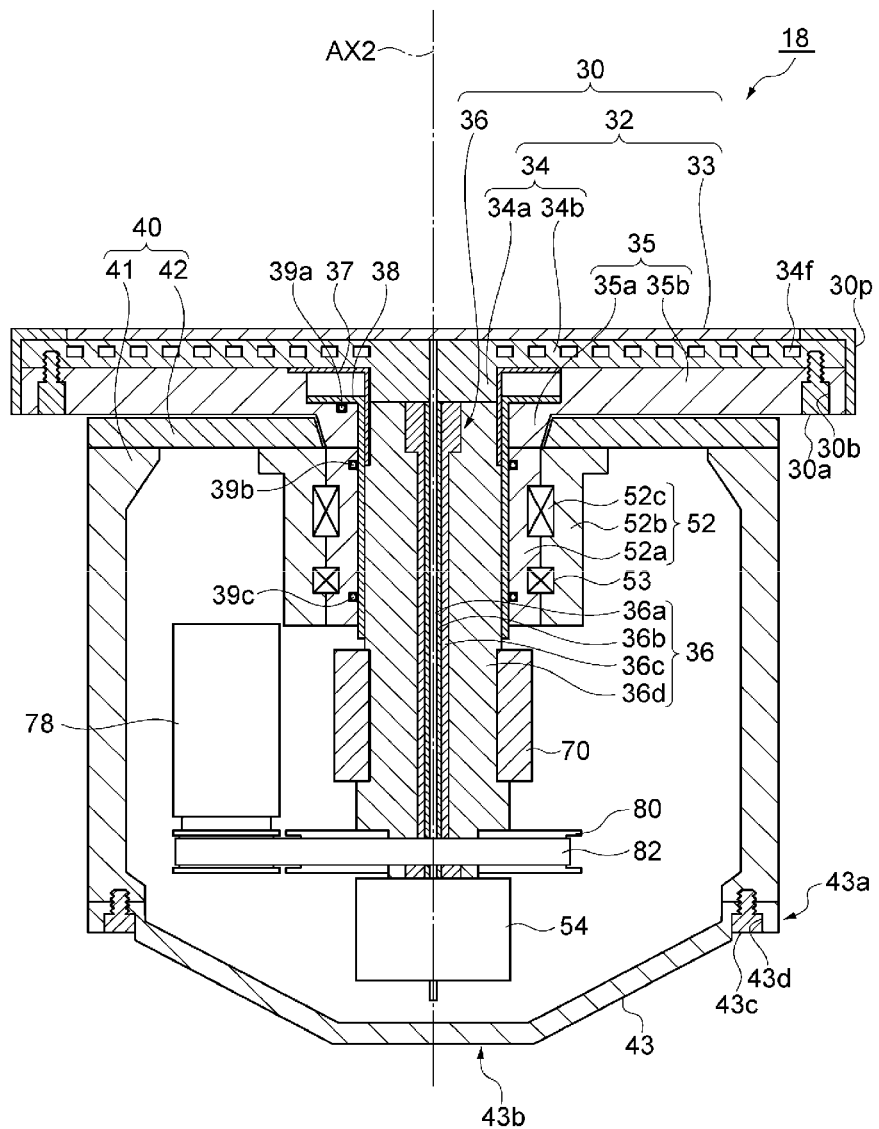
FIG. 6 is a cross-sectional view illustrating the support structure according to the embodiment.

FIGS. 5 and 6 are cross-sectional views illustrating the support structure according to an embodiment. FIG. 5 illustrates a cross-sectional view of the support structure viewed in the Y-direction, and FIG. 6 illustrates a cross-sectional view of the support structure viewed in the X-direction (see FIG. 2). As illustrated in FIGS. 5 and 6, the support structure 18 includes a holding unit 30, a container 40, and a first shaft portion 50.

The holding unit 30 is a mechanism configured to hold the workpiece W thereon and rotate the workpiece W by rotating around the second axis AX 2. The second axis AX2 is an axis orthogonal to the first axis AX1 and coincides with the axis PX when the support structure 18 is in a non-tilted state. The holding unit 30 includes an electrostatic chuck 32, a base member 35, and a second shaft portion 36.

The electrostatic chuck 32 includes an attractive unit 33 and a lower electrode 34. The attractive unit 33 is provided on the lower electrode 34. The lower electrode 34 is provided on the base member 35. The attractive unit 33 is configured to hold a workpiece W on the top surface thereof. The attractive unit 33 has a substantially disc shape, and the central axis thereof substantially coincides with the second axis AX2. The attractive unit 33 has an insulating film and an electrode film provided inside the insulating film. When a voltage is applied to the electrode film, the attractive unit 33 generates an electrostatic force. Due to this electrostatic force, the attractive unit 33 attracts the workpiece W placed on the top surface thereof. A heat transfer gas such as, for example, He gas is supplied between the attractive unit 33 and the workpiece W. A heater for heating the workpiece W may be built in the attractive unit 33.

The lower electrode 34 has a substantially disc shape, and the central axis thereof substantially coincides with the second axis AX2. In an embodiment, the lower electrode 34 has a first portion 34a and a second portion 34b. The first portion 34a is a portion on the center side of the lower electrode 34, and the second portion 34b extends from a location farther away from the second axis AX2 than the first portion 34a, that is, from the outside of the first portion 34a. The top surface of the first portion 34a and the top surface of the second portion 34b are continuous, and the top surface of the first portion 34a and the top surface of the second portion 34b constitute a substantially flat top surface of the lower electrode 34. The attractive unit 33 is in contact with the top surface of the lower electrode 34. In addition, the first portion 34a protrudes downward from the second portion 34b and has a cylindrical shape. That is, the bottom surface of the first portion 34a extends below the bottom surface of the second portion 34b. The lower electrode 34 is made of a conductor such as, for example, aluminum. The lower electrode 34 is electrically connected to the above-described bias power supply 22. That is, a modulated DC voltage from the first power source 22a and high-frequency waves from the second power source 22b are selectively applied to the lower electrode 34. In addition, the lower electrode 34 is provided with a coolant flow path 34f. The temperature of the workpiece W is controlled by supplying a coolant to the coolant flow path 34f.

The base member 35 is made of an insulator such as, for example, quartz or alumina. The base member 35 has a substantially disc shape and is opened at the center thereof. In an embodiment, the base member 35 has a first portion 35a and a second portion 35b. The first portion 35a is a portion on the center side of the base member 35, and the second portion 35b extends from a location farther away from the second axis AX2 than the first portion 35a, that is, from the outside of the first portion 35a. The top surface of the first portion 35a extends below the top surface of the second portion 35b, and the bottom surface of the first portion 35a also extends below the bottom surface of the second portion 35b. The top surface of the second portion 35b of the base member 35 is in contact with the bottom surface of the second portion 34b of the lower electrode 34. On the other hand, the top surface of the first portion 35a of the base member 35 is spaced apart from the bottom surface of the lower electrode 34.

The support structure 18 further includes an insulating protective member 30p. The protective member 30p is made of an insulator such as, for example, quartz or alumina. The protective member 30p has a substantially cylindrical shape, and the upper end portion thereof is smaller in diameter than the other portions of the protective member 30*p*. The protective member 30*p* covers the outer edge portion of the top surface of the electrostatic chuck 32 and the outer peripheral surface of the electrostatic chuck 32. Therefore, the outer edge portion of the top surface of the electrostatic chuck 32 and the outer peripheral surface of the electrostatic chuck 32 are protected from plasma by the protective member 30*p*. Further, the uniformity of plasma density distribution around the workpiece W is improved by the protective member 30*p*.

The holding unit 30 further includes anchors 30*a*. The anchors 30*a* detachably fix the electrostatic chuck 32 to the base member 35. In an embodiment, the anchors 30*a* include a plurality of screws. The base member 35 and the electrostatic chuck 32 of this embodiment have a plurality of holes 30*b* extending from the bottom surface of the base member 35 in the vertical direction to the inside of the electrostatic chuck 32. The surfaces defining the plurality of holes 30*b* provide female threads. A plurality of screws of the anchors 30*a* are respectively screwed to the female threads, whereby the electrostatic chuck 32 is fixed to the base member 35. In addition, when the plurality of screws are removed from the female screws, the electrostatic chuck 32 can be easily removed from the base member 35.

Figure 7A:
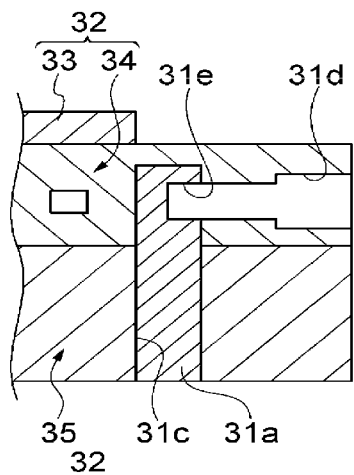
FIGS. 7A to 7C are views illustrating an anchor according to another embodiment.
Figure 7B:
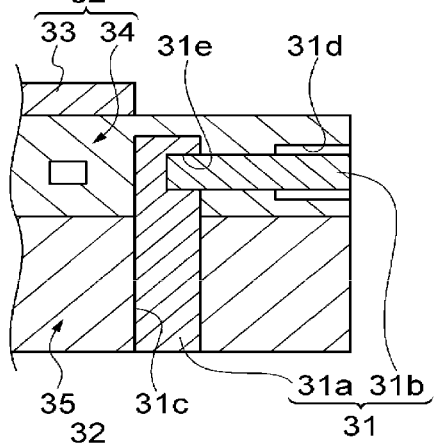
Figure 7C:
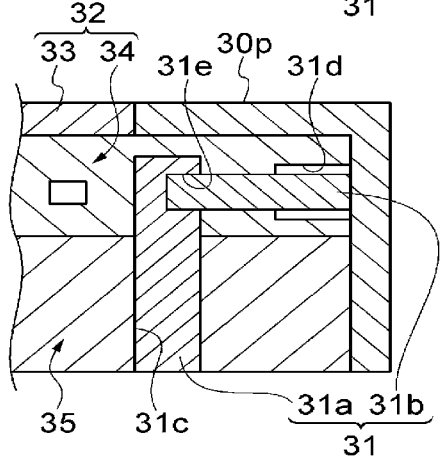

FIGS. 7A to 7C are views illustrating an anchor according to another embodiment. In this embodiment, the holding unit 30 includes anchors 31 in place of the anchors 30*a*. The anchors 31 include a plurality of first columnar bodies 31*a* and a plurality of second columnar bodies 31*b*. A plurality of first holes 31*c* are formed in the base member 35 and the electrostatic chuck 32. The plurality of first holes 31*c* extend from the bottom surface of the base member 35 to the inside of the electrostatic chuck 32 in the vertical direction. In addition, a plurality of second holes 31*d* are formed in the electrostatic chuck 32. The plurality of second holes 31*d* extend from the outer peripheral surface of the electrostatic chuck 32 (the lower electrode 34) and are connected to the plurality of first holes 31*c*, respectively.

When fixing the electrostatic chuck 32 to the base member 35, as illustrated in FIG. 7A, the plurality of first columnar bodies 31*a* are respectively inserted into the plurality of first holes 31*c*. Then, as illustrated in FIG. 7B, the plurality of second columnar bodies 31*b* are inserted into the plurality of second holes 31*d*, respectively. The tip portions of the plurality of second columnar bodies 31*b* are respectively inserted into the holes 31*e* formed in the plurality of first columnar bodies 31*a*. Thereby, the electrostatic chuck 32 is fixed to the base member 35. Thereafter, as illustrated in FIG. 7C, the protective member 30*p* is attached to cover the outer edge portion of the top surface of the electrostatic chuck 32 and the outer peripheral surface of the electrostatic chuck 32.

As illustrated in FIGS. 5 and 6, the second shaft portion 36 extends along the second axis AX2 from the electrostatic chuck 32 to the inside of the container 40. The second shaft portion 36 has a substantially cylindrical shape and is coupled to the bottom surface of the lower electrode 34. Specifically, the second shaft portion 36 is coupled to the bottom surface of the first portion 34*a* of the lower electrode 34. The central axis of the second shaft portion 36 coincides with the second axis AX2. By applying a rotational force to the second shaft portion 36, the holding unit 30 rotates.

A second drive device 78 is provided in the inner space of the support structure 18 (i.e., the space in the container 40). The second shaft portion 36 is connected to the second drive device 78. The second drive device 78 is configured to rotate the holding unit 30 around the second axis line AX2. The second drive device 78 generates a driving force for rotating the second shaft portion 36. In an embodiment, the second drive device 78 is provided at a lateral side of the second shaft portion 36. The second drive device 78 is connected to a pulley 80 attached to the second shaft portion 36 via a transmission belt 82. The rotational driving force of the second drive device 78 is transmitted to the second shaft portion 36 via the pulley 80 and the transmission belt 82. As a result, the holding unit 30 rotates about the second axis AX2.

The holding unit 30 constituted by these various elements forms a hollow space as the inner space of the support structure 18 together with the container 40. The container 40 is provided under the holding unit 30. The container 40 has a cylindrical container body 41, a top cover 42 provided on the top portion of the container body 41, and a bottom cover 43 configured to close the bottom side opening of the container body 41. The top cover 42 has a substantially disc shape. A through hole is formed at the center of the upper cover 42, and the second shaft portion 36 passes through the through hole. The upper cover 42 is provided below the second portion 35*b* of the base member 35 so as to provide a slight gap with respect to the second portion 35*b*. The upper end of the container body 41 is coupled to the peripheral edge of the bottom surface of the upper cover 42.

The bottom cover 43 includes an upper end portion 43*a* and a lower end portion 43*b*. The lower end portion 43*b* is spaced farther away from the container body 41 than the upper end portion 43*a* in the direction in which the second axis AX2 extends. The bottom cover 43 is configured to be detachable from the container body 41. The upper end portion 43*a* is connected to the lower end of the container body 41. A seal member such as an O-ring may be provided between the lower end of the container body 41 and the upper end portion 43*a* of the bottom cover 43. The container body 41 and the bottom cover 43 are coupled to each other with anchors 43*c*. The anchors 43*c* include, for example, a plurality of screws.

At the side of the lower end portion 43*b* from the upper end portion 43*a*, the width of the bottom cover 43 in an arbitrary direction orthogonal to the second axis AX2 is smaller than the width of the upper end portion 43*a* in the arbitrary direction. For example, the width of the bottom cover 43 monotonously decreases between the upper end portion 43*a* and the lower end portion 43*b*. According to the bottom cover 43, the maximum distance DL between the first axis AX1 and the bottom cover 43 becomes small. That is, the rotation radius of the support structure 18 around the first axis AX1 is small. Therefore, it is possible to the size of the chamber S. Therefore, it is possible to reduce the size of the chamber body 12. In addition, the conductance around the support structure 18, particularly, the bottom cover 43, increases. Accordingly, a uniform gas flow is formed in the chamber S. Thus, the uniformity of plasma density distribution on the electrostatic chuck 32 is improved.

In an embodiment, the first axis AX1 includes a position between the center of the support structure 18 in the direction of the second axis AX2 and the top surface of the holding unit 30. That is, in this embodiment, the first shaft portion 50 extends at a position biased toward the electrostatic chuck 32 side from the center of the support structure 18. According to this embodiment, when the second axis AX2 is inclined with respect to the axis PX, it is possible to reduce the difference in distance from the plasma source 16 to respective positions of the workpiece W. Therefore, in-plane uniformity of a plasma processing (e.g., etching) is improved.

In another embodiment, the first axis AX1 includes the center of gravity of the support structure 18. In this embodiment, the first shaft portion 50 extends on the first axis AX1 including the center of gravity. According to this embodiment, the torque required for the first drive device 24 is reduced, and the control of the first drive device 24 is facilitated.

A seal member is interposed between the container 40 and the second shaft portion 36 of the holding unit 30. The seal member separates the space inside the container 40 from the chamber S. The seal member may be a magnetic fluid seal 52 provided between the second shaft portion 36 and the container 40. The magnetic fluid seal 52 has an inner ring portion 52a and an outer ring portion 52b. The inner ring portion 52a has a substantially cylindrical shape extending coaxially with the second shaft portion 36 and is fixed to the second shaft portion 36. In addition, the upper end portion of the inner ring portion 52a is coupled to the bottom surface of the first portion 35a of the base member 35. The inner ring portion 52a rotates together with the second shaft portion 36 around the second axis AX2. The outer ring portion 52b has a substantially cylindrical shape and is provided outside the inner ring portion 52a coaxially with the inner ring portion 52a. The upper end portion of the outer ring portion 52b is coupled to the bottom surface of the center side portion of the top cover 42. A magnetic fluid 52c is interposed between the inner ring portion 52a and the outer ring portion 52b. A bearing 53 is provided between the inner ring portion 52a and the outer ring portion 52b below the magnetic fluid 52c. This magnetic fluid seal 52 provides a seal structure for hermetically sealing the inner space of the support structure 18. With this magnetic fluid seal 52, the space inside the container 40 is separated from the chamber S of the plasma processing apparatus 10. In the plasma processing apparatus 10, the pressure in the space inside the container 40 is maintained at atmospheric pressure.

In an embodiment, a first member 37 and a second member 38 are provided between the magnetic fluid seal 52 and the second shaft portion 36. The first member 37 has a substantially cylindrical shape that extends along a portion of the outer peripheral surface of the second shaft portion 36, that is, along the outer peripheral surface of the upper portion of a third cylindrical portion 36d to be described later and the outer peripheral surface of the first portion 34a of the lower electrode 34. In addition, the upper end of the first member 37 has an annular plate shape extending along the bottom surface of the second portion 34b of the lower electrode 34. The first member 37 is in contact with the outer peripheral surface of the upper portion of the third cylindrical portion 36d and the outer peripheral surface of the first portion 34a and the bottom surface of the second portion 34b of the lower electrode 34.

The second member 38 has a substantially cylindrical shape extending along the outer peripheral surface of the second shaft portion 36, that is, the outer peripheral surface of the third cylindrical portion 36d, and the outer peripheral surface of the first member 37. The upper end of the second member 38 has an annular plate shape extending along the top surface of the first portion 35a of the base member 35. The second member 38 is in contact with the outer peripheral surface of the third cylindrical portion 36d, the outer peripheral surface of the first member 37, the top surface of the first portion 35a of the base member 35, and the inner peripheral surface of the inner ring portion 52a of the magnetic fluid seal 52. A seal member 39a such as, for example, an O-ring is interposed between the second member 38 and the top surface of the first portion 35a of the base member 35. Further, between the second member 38 and the inner peripheral surface of the inner ring portion 52a of the magnetic fluid seal 52, seal members 39b and 39c such as, for example, O-rings are interposed. With such a structure, the space between the second shaft portion 36 and the inner ring portion 52a of the magnetic fluid seal 52 is sealed. Thus, even if a gap exists between the second shaft portion 36 and the magnetic fluid seal 52, the space inside the container 40 is separated from the chamber S of the plasma processing apparatus 10.

An opening is formed in the container main body 41 along the first axis line AX1. The inner end portion of the first shaft portion 50 is fitted into the opening formed in the container body 41. The first shaft portion 50 is hollow and has a substantially cylindrical shape, and its central axis coincides with the first axis AX1. As illustrated in FIG. 1, the first shaft portion 50 extends from the inside of the chamber body 12 to the outside of the chamber body 12 along the first axis AX1. Outside the chamber body 12, the first drive device 24 described above is coupled to one outer end portion of the first shaft portion 50. The first drive device 24 pivotally supports the one outer end portion of the first shaft portion 50.

As illustrated in FIG. 5, the support structure 18 further includes a plurality of pusher pins 91, a plurality of third drive devices 92, and a plurality of holders 93. Although one unit 90 including one pusher pin 91, one third drive device 92, and one holder 93 is illustrated in FIG. 5, the support structure 18 includes a plurality of units 90. In addition, a plurality of through holes 94 extending in the vertical direction are formed in the holding unit 30. The plurality of through holes 94 are arranged in the circumferential direction with respect to the second axis AX2. The plurality of units 90 are arranged in the circumferential direction with respect to the second axis AX2 such that the plurality of pusher pins 91 can be inserted into the plurality of through holes 94, respectively. That is, the plurality of units 90 are arranged such that the plurality of pusher pins 91 are disposed with a relative positional relationship which is the same as the relative positional relationship of the plurality of through holes 94. In addition, a plurality of through holes are formed in the top cover 42 above the plurality of respective pusher pins 91. On the surface defining the plurality of through holes in the top cover 42, a seal member such as, for example, an O ring may be provided to seal a gap between the surface and the plurality of pusher pins 91.

The plurality of third drive devices 92 are provided in the container 40. The plurality of third drive devices 92 are configured to individually move the plurality of pusher pins 91 in order to change the positions of the upper ends of the plurality of pusher pins 91 between a position above the top surface of the electrostatic chuck 32 and a position inside the container 40.

The plurality of holders 93 form a cylindrical shape. In each unit 90, the holder 93 is fixed to the drive shaft of the third drive device 92 such that the holder 93 extends in the vertical direction. In each unit 90, a cylindrical sleeve 95 is provided around the holder 93 coaxially with the holder 93. The length of the sleeve 95 is longer than the length of the holder 93, and the sleeve 95 extends to the vicinity of the top cover 42 or to the top cover 42. In each unit 90, the pusher pin 91 is guided by the sleeve 95. Further, in each unit 90, the base end portion of the pusher pin 91, that is, the end portion on the opposite side from the upper end, is fitted into the inner hole of the holder 93.

In this manner, in the support structure 18, a third drive device 92 dedicated to each of the plurality of pusher pins 91 is provided. Therefore, compared to a drive mechanism of a type in which a link supporting a plurality of pusher pins is vertically moved by a single drive device, it is possible to precisely control the position of the upper end of each of the plurality of pusher pins 91. In addition, when the workpiece W is moved upward from the electrostatic chuck 32, the precision of monitoring the driving force applied to the workpiece W by each of the plurality of pusher pins 91 is improved. Further, the plurality of third drive devices 92 are motors, and the driving force may be detected by monitoring the torque of each of the plurality of third drive devices 92 by monitoring the currents in the plurality of third drive devices 92. Further, the support structure 18 does not contain a link in the container 40. Therefore, it is possible to effectively use the space inside the container 40.

As illustrated in FIGS. 5 and 6, the second shaft portion 36 has a columnar portion 36a, a first cylindrical portion 36b, a second cylindrical portion 36c, and a third cylindrical portion 36d. The columnar portion 36a has a substantially cylindrical shape and extends on the second axis AX2. The columnar portion 36a is a wire for applying a voltage to the electrode film of the attractive unit 33. The columnar portion 36a is electrically connected to the electrode film of the attractive unit 33 and is also connected to the wire 60 via a rotary connector 54 such as, for example, a slip ring. The wire 60 extends from the inner space of the container 40 through the inner hole of the first shaft portion 50 to the outside of the chamber body 12. This wire 60 is connected to a power source 62 (see FIG. 1) via a switch outside the chamber body 12.

The first cylindrical portion 36b is provided coaxially with the columnar portion 36a outside the columnar portion 36a. The first cylindrical portion 36b is a wire for supplying a modulated DC voltage and high-frequency waves for bias to the lower electrode 34. The first cylindrical portion 36b is electrically connected to the lower electrode 34 and connected to the wire 64 via the rotary connector 54. The wire 64 extends from the inner space of the container 40 through the inner hole of the first shaft portion 50 to the outside of the chamber body 12. The wire 64 is connected to the first power source 22a and the second power source 22b of the bias power supply 22 outside the chamber body 12. A matcher for impedance matching may be provided between the second power supply 22b and the wire 64.

The second cylindrical portion 36c is provided coaxially with the first cylindrical portion 36b outside the first cylindrical portion 36b. In an embodiment, a bearing 55 is provided inside the rotary connector 54 described above, and the bearing 55 is provided along the outer peripheral surface of the second cylindrical portion 36c. The bearing 55 supports the second shaft portion 36 via the second cylindrical portion 36c. The bearing 53 described above supports the upper portion of the second shaft portion 36, whereas the bearing 55 supports the lower portion of the second shaft portion 36. Since the second shaft portion 36 is supported at both the upper portion and the lower portion thereof by the two bearings 53 and 55 in this way, the second shaft portion 36 is capable of being stably rotated about the second axis AX2.

A gas line for supplying heat transfer gas is formed in the second cylindrical portion 36c. This gas line is connected to a pipe 66 via a rotary joint such as, for example, a swivel joint. The pipe 66 extends from the inner space of the container 40 to the outside of the chamber body 12 through the inner hole of the first shaft portion 50. The pipe 66 is connected to a heat transfer gas source 68 (see FIG. 1) outside the chamber body 12.

The third cylindrical portion 36d is provided coaxially with the second cylindrical portion 36c outside the first cylindrical portion 36c. A coolant supply line for supplying a coolant to the coolant flow path 34f and a coolant recovery line for recovering the coolant supplied to the coolant flow path 34f are formed in the third cylindrical portion 36d. The coolant supply line is connected to the pipe 72 via a rotary joint 70 such as, for example, a swivel joint. Further, the coolant recovery line is connected to the pipe 74 via the rotary joint 70. The pipe 72 and the pipe 74 extend from the inner space of the container 40 to the outside of the chamber main body 12 through the inner hole of the first shaft portion 50. The pipe 72 and the pipe 74 are connected to a chiller unit 76 (see FIG. 1) outside the chamber body 12.

In this manner, wires for various electrical systems, a pipe for heat transfer gas, and a pipe for coolant pass through the inner hole of the first shaft portion 50. For example, a plurality of wires electrically connected to the second drive device 78 further pass through the inner hole of the first shaft portion 50. The wires for supplying electric power to the second drive device 78 are drawn to the outside of the chamber main body 12 through the inner hole of the first shaft portion 50 and are connected to a motor power source provided outside the chamber main body 12.

This support structure 18 is capable of being provided with various mechanisms in the inner space of the container 40 that can be maintained at atmospheric pressure. In addition, the support structure 18 is configured to allow the wires and pipes for connecting the mechanisms accommodated in the inner space and the devices such as, for example, the power source, the gas source, and the chiller unit provided outside the chamber body 12, to be drawn out to the outside of the chamber body 12. In addition to the above-described wires and pipes, a wire connecting the heater power source provided outside the chamber body 12 and the heater provided in the attractive unit 33 may be drawn out from the inner space of the container 40 to the outside of the chamber body 12 through the inner hole of the first shaft portion 50.

Figure 8:
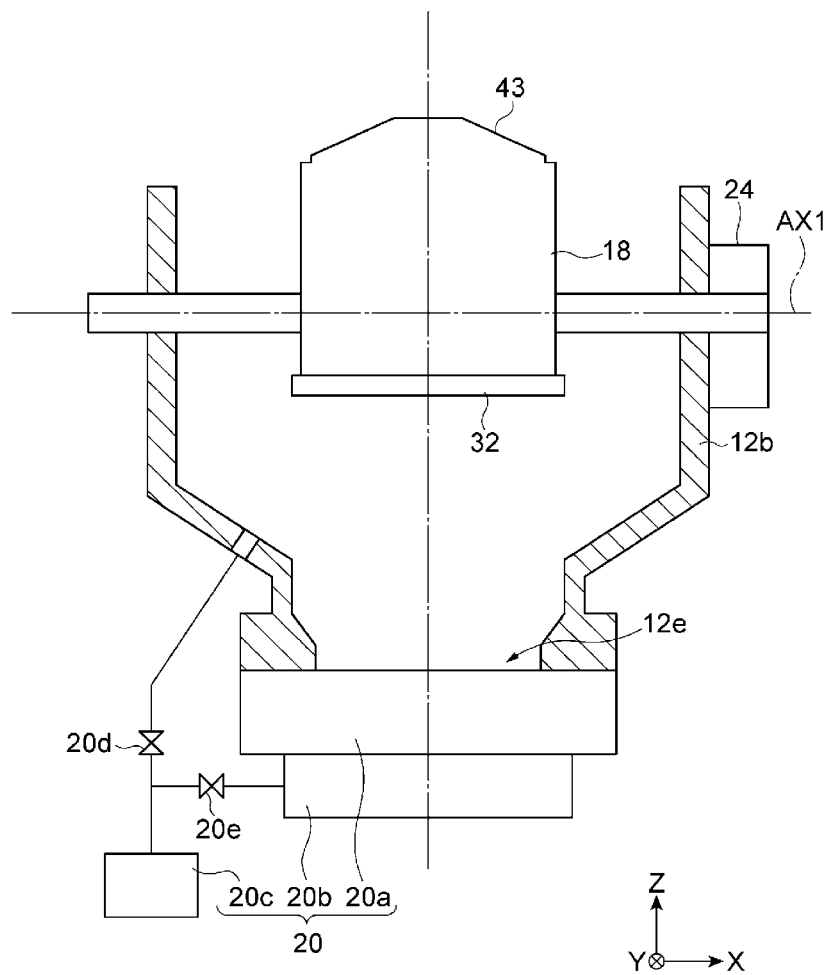
FIG. 8 is a view illustrating a support structure in the state where the bottom cover is positioned above the electrostatic chuck.

Hereinafter, a maintenance method of the plasma processing apparatus 10 will be described. FIG. 8 is a view illustrating the support structure 18 in the state where the bottom cover is positioned above the electrostatic chuck. In this maintenance method, in order to perform maintenance such as replacement of components inside the support structure 18, the first drive device 24 causes the support structure 18 to be rotated about the first axis AX1 such that the bottom cover 43 is positioned above the electrostatic chuck 32. In addition, the upper portion 12a of the chamber body 12 is removed from the intermediate portion 12b.

Figure 9:
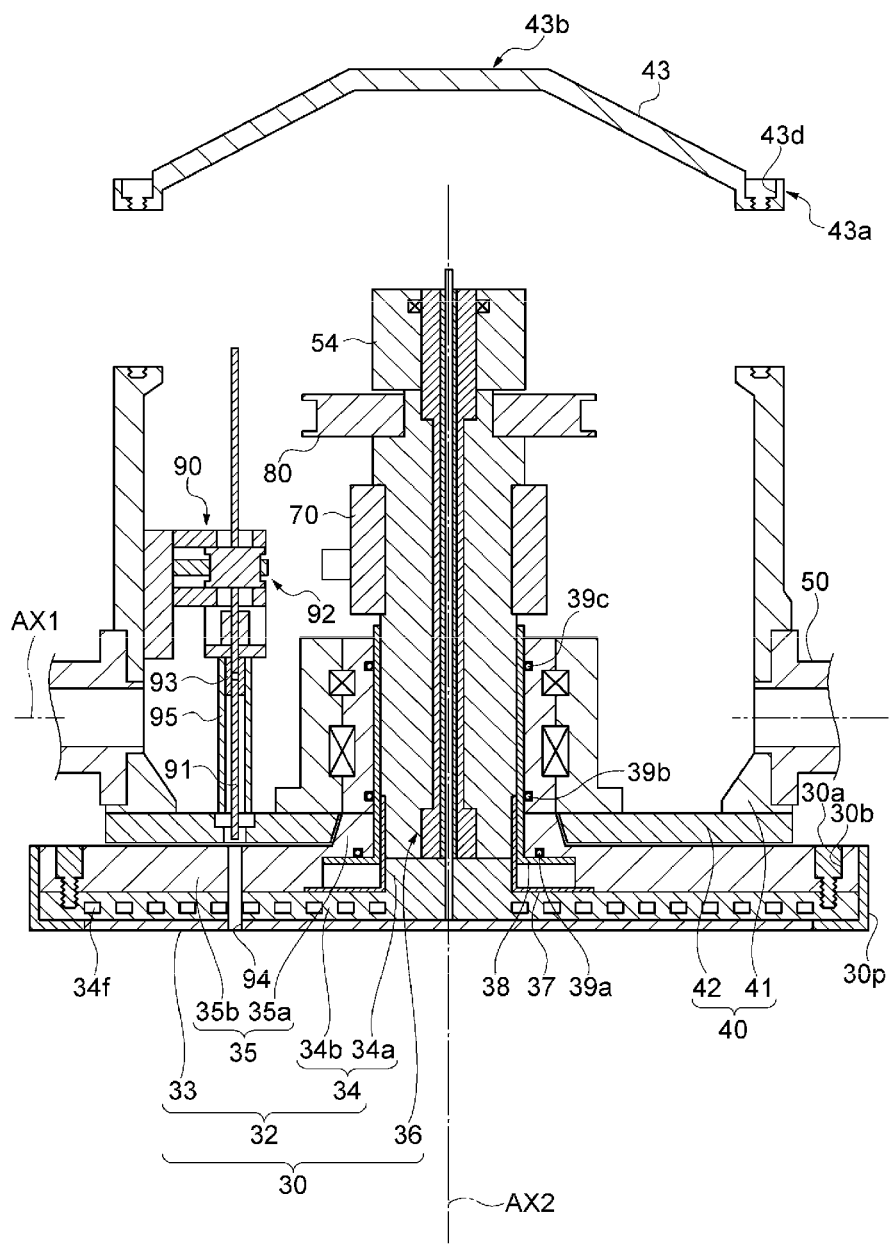
FIG. 9 is a view illustrating the support structure in the state where the bottom cover is removed.

FIG. 9 is a view illustrating the support structure in the state where the bottom cover is removed. In the main maintenance method, as illustrated in FIG. 9, the bottom cover 43 is detached from the container main body 41. Thereafter, maintenance such as replacement of components accommodated in the container 40 is performed. In this manner, it is possible to easily access the components accommodated in the container 40 of the support structure 18 in the state where the support structure 18 is disposed inside the chamber body 12. Therefore, maintenance of components constituting the support structure 18 is facilitated.

Figure 10:
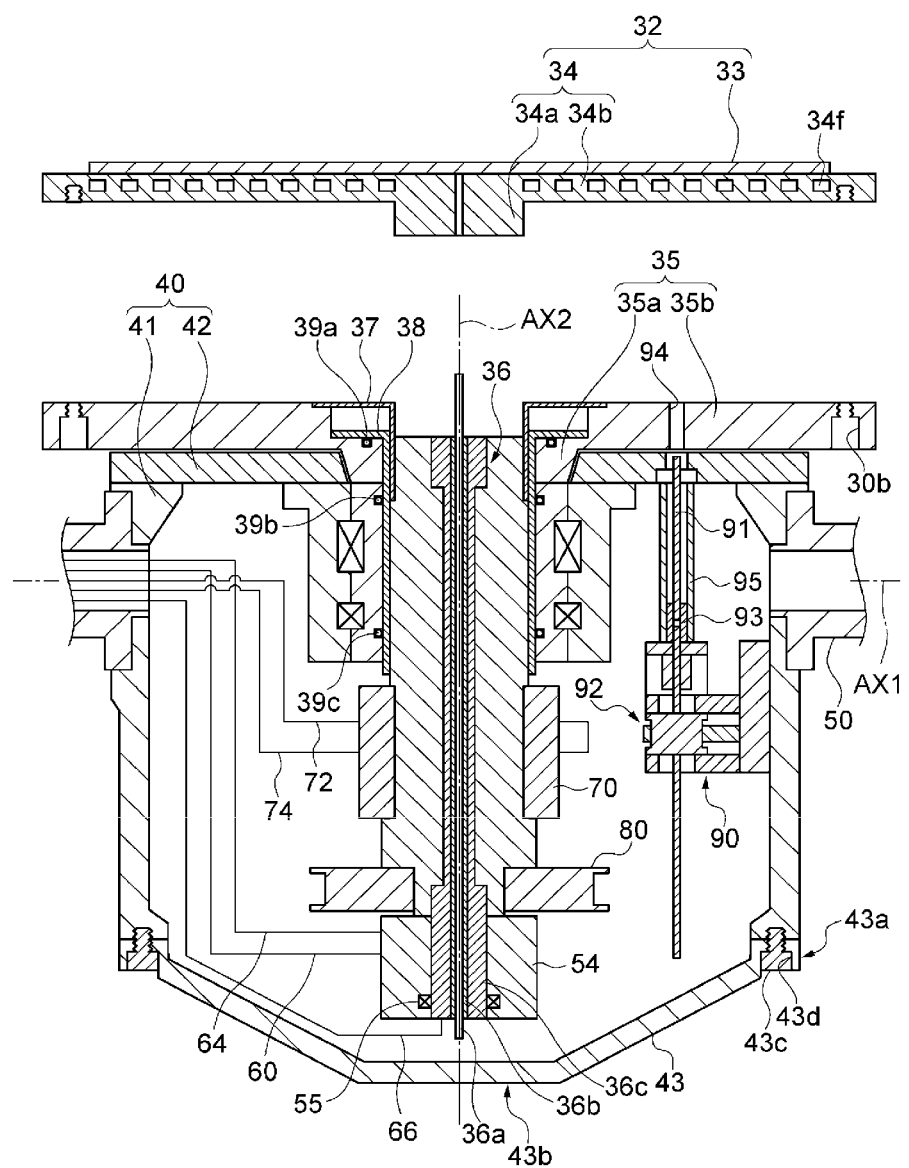
FIG. 10 is a view illustrating the support structure in the state where the electrostatic chuck is removed.

FIG. 10 is a view illustrating the support structure in the state where the electrostatic chuck is removed. In this maintenance method, for maintenance such as replacement of the electrostatic chuck 32, the electrostatic chuck 32 is positioned above the bottom cover 43 and the upper portion 12a of the chamber body 12 is detached from the intermediate portion 12b. Next, fixing of the electrostatic chuck 32 to the base member 35 by the anchors is released. In addition, as illustrated in FIG. 10, the electrostatic chuck 32 is detached from the base member. In this way, it is possible to easily perform maintenance such as replacement of the electrostatic chuck 32 in the state where the support structure 18 disposed inside the chamber S.

Figure 11:
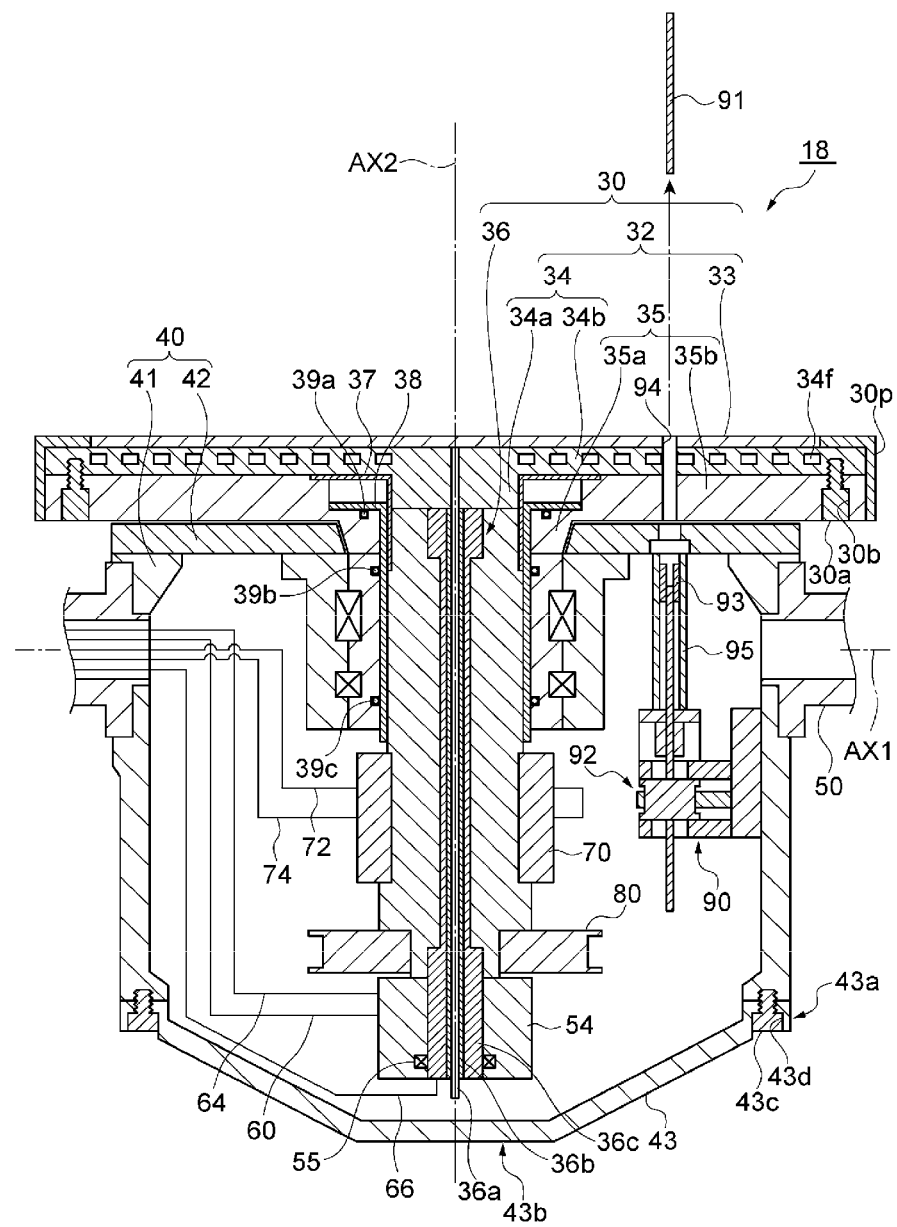
FIG. 11 is a view illustrating the support structure in the state where a pusher pin has been pulled out.

FIG. 11 is a view illustrating the support structure in the state where a pusher pin has been pulled out. In this maintenance method, for maintenance such as replacement of the pusher pin 91, the electrostatic chuck 32 is positioned above the bottom cover 43 and the upper portion 12a of the chamber body 12 is detached from the intermediate portion 12b. Further, the pusher pin 91 is moved by the third drive device 92 such that the upper end of the pusher pin 91 is positioned above the top surface of the electrostatic chuck 32 (see the state illustrated in FIG. 5). Then, as illustrated in FIG. 11, the pusher pin 91 is pulled out upward from the corresponding holder 93. Then, the base end portion of the pusher pin 91 or another pusher pin 91 repaired after pulled out is fitted into the holder 93. In this way, the pusher pin can be easily pulled out from the holder 93 in the state where the upper end of the pusher pin 91 is positioned above the top surface of the electrostatic chuck 32. Therefore, it is possible to easily perform maintenance such as replacement of the pusher pins 91.

DESCRIPTION OF SYMBOLS

10: plasma processing apparatus, 12: chamber body, 14: gas supply unit, 16: plasma source, 18: support structure, 20: exhaust device, 24: first drive device, 30: holding unit, 30a: anchor, 30p: protective member, 31: anchor, 31a: first columnar body, 31b: second columnar body, 31c: first hole, 31d: second hole, 32: electrostatic chuck, 33: attractive unit, 34: lower electrode, 35: base member, 36: second shaft portion, 40: container, 41: container body, 43: bottom cover, 43a: upper end portion 43b: lower end portion, 50: first shape portion, 52: magnetic fluid seal, 54: rotary connector, 60: wire, 62: power source, 64: wire, 66: pipe, 68: heat transfer gas source, 70: rotary joint, 72: pipe, 74: pipe, 76: chiller unit, 78: second drive device, 80: pulley, 91: pusher pin, 92: third drive device, 93: holder, 94: through hole, 150A, 150B: high-frequency power source, AX1: first axis, AX2: second axis, Cnt: controller, S: chamber, W: workpiece

The invention claimed is:

1. A maintenance method of a plasma processing apparatus for performing a plasma processing on a workpiece, the plasma processing apparatus includes: a chamber body that provides a chamber; a gas supply unit configured to supply a gas to the chamber, an exhaust device configured to decompress the chamber; a plasma source configured to excite the gas inside the chamber; a support structure configured to support the workpiece inside the chamber body; and a first drive device configured to rotate the support structure inside the chamber about a first axis that extends in a direction orthogonal to a vertical direction,
wherein the support member includes: a holding unit including an electrostatic chuck configured to hold the workpiece and provided to be rotatable around a second axis orthogonal to the first axis; a container provided below the holding unit; a seal member interposed between the container and the holding unit and configured to separate a space inside the container from the chamber; a second drive device provided inside the container and configured to rotate the holding unit around the second axis; and a rotary connector electrically connected to an electrode of the electrostatic chuck,
wherein the container includes: a cylindrical container body; and a bottom cover closing a bottom side opening of the container body and configured to be detachable from the container body, and
the maintenance method comprises:
rotating the support structure about the first axis such that the bottom cover is positioned above the electrostatic chuck;
removing the bottom cover from the container body; and
maintaining a component provided in the container body.

2. The maintenance method of claim 1, wherein the holding unit further includes an insulating base member interposed between the electrostatic chuck and the container body, and an anchor configured to detachably fix the electrostatic chuck to the base member,
the maintenance method further comprising:
releasing fixation of the electrostatic chuck to the base member by the anchor; and
detaching the electrostatic chuck from the base member.

3. The maintenance method of claim 1, wherein the holding unit has a plurality of through holes formed to extend in a direction in which the second axis extends, and
wherein the support member includes: a plurality of pusher pins provided to be insertable into the plurality of through holes, respectively; a plurality of third drive devices provided inside the container and configured to move the plurality of pusher pins individually so as to change positions of upper ends of the plurality of pusher pins between a position above the top surface of the electrostatic chuck and a position inside the container; and a plurality of holders each having a cylindrical shape and respectively attached to the plurality of third drive devices, the plurality of holders having inner holes into which base ends of the plurality of pusher pins are fitted, respectively,
the maintenance method further comprising:
moving at least one pusher among the plurality of pusher pins such that the upper end of the at least one pusher pin is positioned above the top surface of the electrostatic chuck, and
pulling out the at least one pusher pin from at least one corresponding holder among the plurality of holders.

4. The maintenance method of claim 1, wherein the chamber body further includes an intermediate portion, an upper portion detachably coupled to an upper side of the intermediate portion, and a lower portion coupled to a lower side of the intermediate portion,
the maintenance method further comprising:
removing the upper portion from the intermediate portion.

5. The maintenance method of claim 2, wherein the holding unit has a plurality of through holes formed to extend in a direction in which the second axis extends, and
wherein the support member includes: a plurality of pusher pins provided to be insertable into the plurality of through holes, respectively; a plurality of third drive devices provided inside the container and configured to move the plurality of pusher pins individually so as to change positions of upper ends of the plurality of pusher pins between a position above the top surface of the electrostatic chuck and a position inside the container; and a plurality of holders each having a cylindrical shape and respectively attached to the plurality of third drive devices, the plurality of holders having inner holes into which base ends of the plurality of pusher pins are fitted, respectively, the maintenance method further comprising:

moving at least one pusher among the plurality of pusher pins such that the upper end of the at least one pusher pin is positioned above the top surface of the electrostatic chuck, and pulling out the at least one pusher pin from at least one corresponding holder among the plurality of holders.

6. The maintenance method of claim 2, wherein the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

7. The maintenance method of claim 3, wherein the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

8. The maintenance method of claim 5, wherein the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

9. A maintenance method of a plasma processing apparatus, the plasma processing apparatus includes: a support structure configured to support a workpiece; and a drive device configured to rotate the support structure about a first axis that extends in a direction orthogonal to a vertical direction, wherein the support member includes: a holding unit including an electrostatic chuck configured to hold the workpiece; and a container provided below the holding unit, wherein the container includes: a container body; and a bottom cover closing a bottom side opening of the container body and configured to be detachable from the container body, and the maintenance method comprises:

rotating the support structure about the first axis such that the bottom cover is positioned above the electrostatic chuck;

removing the bottom cover from the container body; and maintaining a component provided in the container body.

10. The maintenance method of claim 9, wherein the holding unit further includes an insulating base member interposed between the electrostatic chuck and the container body, and an anchor configured to detachably fix the electrostatic chuck to the base member, the maintenance method further comprising:

releasing fixation of the electrostatic chuck to the base member by the anchor; and detaching the electrostatic chuck from the base member.

11. The maintenance method of claim 9, wherein the holding unit has a plurality of through holes formed to extend in a direction in which a second axis extends orthogonally to the first axis, and wherein the support member includes: a plurality of pusher pins provided to be insertable into the plurality of through holes, respectively; a plurality of drive devices provided inside the container and configured to move the plurality of pusher pins individually so as to change positions of upper ends of the plurality of pusher pins between a position above the top surface of the electrostatic chuck and a position inside the container; and a plurality of holders respectively attached to the plurality of drive devices, the plurality of holders having inner holes into which base ends of the plurality of pusher pins are fitted, respectively, the maintenance method further comprising:

moving at least one pusher among the plurality of pusher pins such that the upper end of the at least one pusher pin is positioned above the top surface of the electrostatic chuck, and pulling out the at least one pusher pin from at least one corresponding holder among the plurality of holders.

12. The maintenance method of claim 9, wherein the plasma processing apparatus includes a chamber body that provides a chamber, and the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

13. The maintenance method of claim 10, wherein the holding unit has a plurality of through holes formed to extend in a direction in which a second axis extends orthogonally to the first axis, and wherein the support member includes: a plurality of pusher pins provided to be insertable into the plurality of through holes, respectively; a plurality of drive devices provided inside the container and configured to move the plurality of pusher pins individually so as to change positions of upper ends of the plurality of pusher pins between a position above the top surface of the electrostatic chuck and a position inside the container; and a plurality of holders respectively attached to the plurality of drive devices, the plurality of holders having inner holes into which base ends of the plurality of pusher pins are fitted, respectively, the maintenance method further comprising:

moving at least one pusher among the plurality of pusher pins such that the upper end of the at least one pusher pin is positioned above the top surface of the electrostatic chuck, and pulling out the at least one pusher pin from at least one corresponding holder among the plurality of holders.

14. The maintenance method of claim 10, wherein the plasma processing spparatus includes a chamber body that provides a chamber, and the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

15. The maintenance method of claim 11, wherein the plasma processing apparatus includes a chamber body that provides a chamber, and the chamber body further includes an intermediate portion, an upper portion detachably coupled to an upper side of the intermediate portion, and a lower portion coupled to a lower side of the intermediate portion, the maintenance method further comprising:

removing the upper portion from the intermediate portion.

16. The maintenance method of claim 13, wherein the plasma processing apparatus includes a chamber body that provides a chamber, and
the chamber body further includes an intermediate portion, an upper portion detachably coupled to an upper side of the intermediate portion, and a lower portion coupled to a lower side of the intermediate portion,
the maintenance method further comprising:
removing the upper portion from the intermediate portion.

* * * * *